US005757838A

United States Patent [19]
Hasegawa et al.

[11] Patent Number: 5,757,838
[45] Date of Patent: May 26, 1998

[54] OUTPUT CONTROL METHOD FOR EXCIMER LASER

[75] Inventors: Noriyasu Hasegawa; Kunitaka Ozawa, both of Utsunomiya; Hiroshi Kurosawa, Matsudo; Keiji Yoshimura, Utsunomiya, all of Japan

[73] Assignee: Canon Kabushiki Kaisha, Tokyo, Japan

[21] Appl. No.: 658,078

[22] Filed: Jun. 4, 1996

[30] Foreign Application Priority Data

| Jun. 5, 1995 | [JP] | Japan | 7-137860 |
| Jun. 7, 1995 | [JP] | Japan | 7-140569 |
| Jun. 8, 1995 | [JP] | Japan | 7-141946 |
| Jan. 8, 1996 | [JP] | Japan | 8-018380 |

[51] Int. Cl.$^6$ .................................................. H01S 3/22
[52] U.S. Cl. .................... 372/57; 372/25; 355/62; 355/53
[58] Field of Search ............... 372/25, 57; 355/69, 355/53; 250/205; 27/74

[56] References Cited

U.S. PATENT DOCUMENTS

| 3,823,318 | 7/1974 | Krause | 250/214 P |
| 4,519,692 | 5/1985 | Michalik | 354/412 |
| 4,711,568 | 12/1987 | Torigoe et al. | 355/68 |
| 4,804,978 | 2/1989 | Tracy | 346/108 |
| 4,822,975 | 4/1989 | Torigoe | 219/121.85 |
| 4,884,101 | 11/1989 | Tanimoto | 355/68 |
| 4,947,047 | 8/1990 | Muraki | 250/205 |
| 4,970,546 | 11/1990 | Suzuki et al. | 355/53 |
| 4,974,919 | 12/1990 | Muraki et al. | 350/6.6 |
| 5,053,614 | 10/1991 | Yui et al. | 250/205 |
| 5,107,275 | 4/1992 | Tsuruoka et al. | 346/1.1 |
| 5,119,390 | 6/1992 | Ohmori | 372/25 |
| 5,121,160 | 6/1992 | Sano et al. | 355/53 |
| 5,171,965 | 12/1992 | Suzuki et al. | 219/121.6 |
| 5,191,374 | 3/1993 | Hazama et al. | 355/43 |
| 5,250,797 | 10/1993 | Sano et al. | 250/205 |
| 5,475,491 | 12/1995 | Shiozawa | 356/394 |
| 5,491,534 | 2/1996 | Shiozawa | 355/53 |

FOREIGN PATENT DOCUMENTS

| 61-97830 | 5/1986 | Japan. |
| 4-69660 | 3/1992 | Japan. |
| 5-62876 | 3/1993 | Japan. |
| 6-119971 | 4/1994 | Japan. |

*Primary Examiner*—Leon Scott, Jr.
*Attorney, Agent, or Firm*—Fitzpatrick, Cella, Harper & Scinto

[57] ABSTRACT

An output control method for an excimer laser includes providing plural light pulses, and changing an emission interval for the light pulses, wherein the emission interval is controlled so that an average laser output of each light pulse becomes higher than that when the emission interval is unchanged.

14 Claims, 16 Drawing Sheets

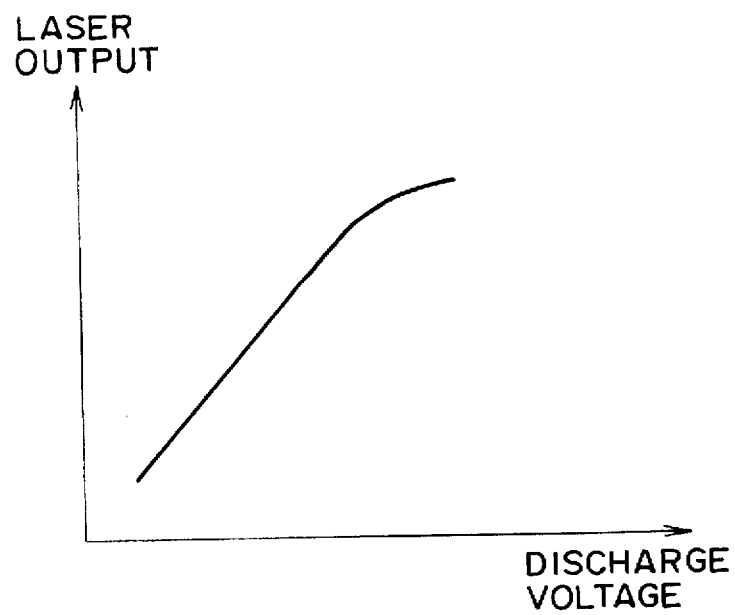
F I G. 14
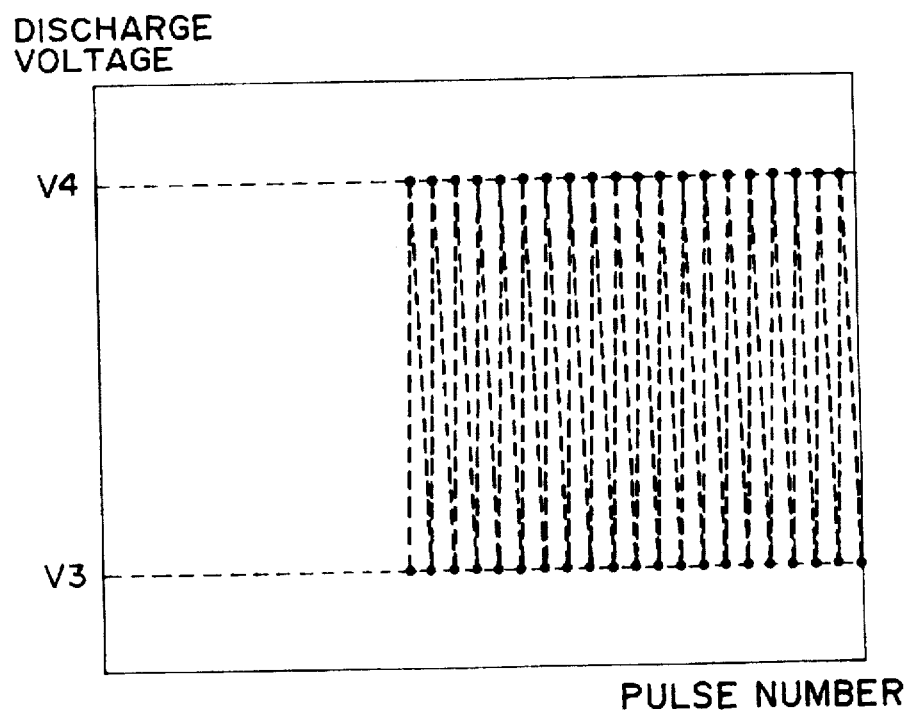
F I G. 15

OUTPUT CONTROL METHOD FOR EXCIMER LASER

FIELD OF THE INVENTION AND RELATED ART

This invention relates to an output control method for an excimer laser and, more particularly, to an output control method for an excimer laser to be used as a light source of a semiconductor exposure apparatus, for example.

A discharge excitation type excimer laser is used as a light source of a semiconductor exposure apparatus or a processing apparatus. Conventionally, when an excimer laser is used in such apparatus, several tens to several hundreds light pulses are required in a single process.

In order to reduce the number of pulses, the output of the excimer laser has to be increased. Conventionally, the output is increased by enlarging the discharge voltage of the excimer laser. However, increasing the output by enlarging the discharge voltage has a limitation and thus there is a limitation to the width of change of the laser output.

On the other hand, in excimer lasers, the state of electrode or gas that dominates the discharge changes transitionally just after start of light emission. More specifically, as shown in FIG. 1, the energy is high at the start of light emission and it decreases gradually (this is called "spike phenomenon"). Conventional devices are arranged to control the discharge voltage to reduce the spike phenomenon so as to obtain stable output of each light pulse.

The above-described method requires control based on low discharge voltage. However, there is a relation between discharge voltage and output dispersion such as shown in FIG. 2, wherein the output dispersion becomes greater as the discharge voltage becomes lower. Thus, it is difficult to completely remove the spike phenomenon.

Conventionally, it has been considered that the spike phenomenon is a phenomenon that occurs at the time of start of light emission, as shown in FIG. 1. However, on the basis of experiments, the inventors of the subject application have found that the spike phenomenon can be produced during successive light emissions of laser as shown in FIG. 3, (A) and (B).

More specifically, when the emission interval from start of light emission is set as shown in FIG. 3, part (A), the laser output changes such as shown in FIG. 3, part (B). This suggests that, even during successive light emissions, the spike phenomenon can be produced by controlling the emission interval so as to disturb the laser phenomenon converging toward a steady state.

SUMMARY OF THE INVENTION

It is an object of the present invention to provide a unique and improved output control method for an excimer laser which is based on the phenomenon that the spike phenomenon can be produced during successive light emissions of a laser, by which higher average pulse output and stable laser output are assured.

It is another object of the present invention to provide an excimer laser which is controlled in accordance with the output control method described above.

It is a further object of the present invention to provide an-exposure apparatus which is based on the output control method described above.

In accordance with an aspect of the present invention, there is provided an output control method for an excimer laser, comprising the steps of: providing plural light pulses; and changing an emission interval for the light pulses; wherein the emission interval is controlled so that an average laser output of each light pulse becomes higher than that when the emission interval is unchanged.

In accordance with another aspect of the present invention, there is provided an excimer laser, comprising: means for providing plural light pulses; and changing means for changing an emission interval for the light pulses; wherein the emission interval is controlled so that an average laser output of each light pulse becomes higher than that when the emission interval is unchanged.

In one preferred form of this aspect of the present invention, the excimer laser further comprises maintaining means for maintaining the emission interval constant, and interchanging means for interchanging said maintaining means and said changing means.

In another preferred form of this aspect of the present invention, the excimer laser further comprises detecting means for detecting laser output of a light pulse provided, wherein said excimer laser controls the laser output on the basis of the detection by said detecting means.

In accordance with a further aspect of the present invention, there is provided an exposure apparatus, comprising: an excimer laser; and changing means for changing an emission interval for light pulses to be provided by said excimer laser; wherein the emission interval is controlled so that an average laser output of each light pulse becomes higher than that when the emission interval is unchanged.

In one preferred form of this aspect of the present invention, the apparatus further comprises detecting means for detecting laser output of a light pulse provided, wherein said exposure apparatus controls the laser output on the basis of the detection by said detecting means.

In another preferred form of this aspect of the present invention, said changing means controls the emission interval so as to minimize an exposure time.

In a further preferred form of this aspect of the present invention, the apparatus further comprises discharge voltage controlling means for controlling a discharge voltage of said excimer laser in accordance with a change in emission interval, wherein said discharge voltage controlling means controls the discharge voltage so that a laser output of each light pulse becomes substantially constant.

In accordance with a still further aspect of the present invention, there is provided an exposure apparatus, comprising: an excimer laser; changing means for changing an emission interval of light pulses to be provided by said excimer laser; and discharge voltage controlling means for controlling a discharge voltage of said excimer laser in accordance with a change in emission interval, wherein the discharge voltage is controlled so that a laser output of each light pulse becomes substantially constant.

In one preferred form of this aspect of the present invention, said exposure apparatus comprises a scan type exposure apparatus.

In a yet further aspect of the present invention, there is provided an exposure method, comprising: causing an excimer laser to provide plural light pulses until a correct exposure amount of a substrate is reached; and changing a light emission interval, until a predetermined exposure amount smaller than the correct exposure amount is reached, so that an average laser output of each pulse becomes higher than that where the light emission interval is unchanged.

In one preferred form of this aspect of the present invention, the method further comprises controlling, after the predetermined exposure amount is reached, the laser output so that the exposure amount of the substrate becomes substantially equal to the correct exposure amount.

In accordance with a yet further aspect of the present invention, there is provided a device manufacturing method, comprising: causing an excimer laser to provide plural light pulses to a substrate; and changing a light emission interval for the light pulses; wherein the light emission interval is controlled so that an average laser output of each pulse becomes higher than that where the light emission interval is unchanged.

In accordance with a yet further aspect of the present invention, there is provided a device manufacturing method, comprising the steps of: causing an excimer laser to provide plural light pulses to a substrate; changing a light emission interval for the light pulses; and controlling discharge voltage for the excimer laser in accordance with a change in the light emission interval; wherein the discharge voltage is controlled so that a laser output of each pulse becomes substantially constant.

The output control method for an excimer laser according to the present invention, as well as an excimer laser, an exposure apparatus and exposure method which are based on the output control method, assure correct production of devices such as semiconductor devices (e.g., ICs or LSIs), liquid crystal devices, image-pickup devices (e.g., CCDs) or magnetic heads, for example.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 14 is a graph for explaining the relation between laser output and discharge voltage, in a case where light emission interval is unchanged.

FIG. 15 is a graph for explaining the relation between laser output and pulse number, adapted to provide uniform exposure with the light emission interval as shown in FIG. 8.

DESCRIPTION OF THE PREFERRED EMBODIMENTS

[First Embodiment]

Figure 4:
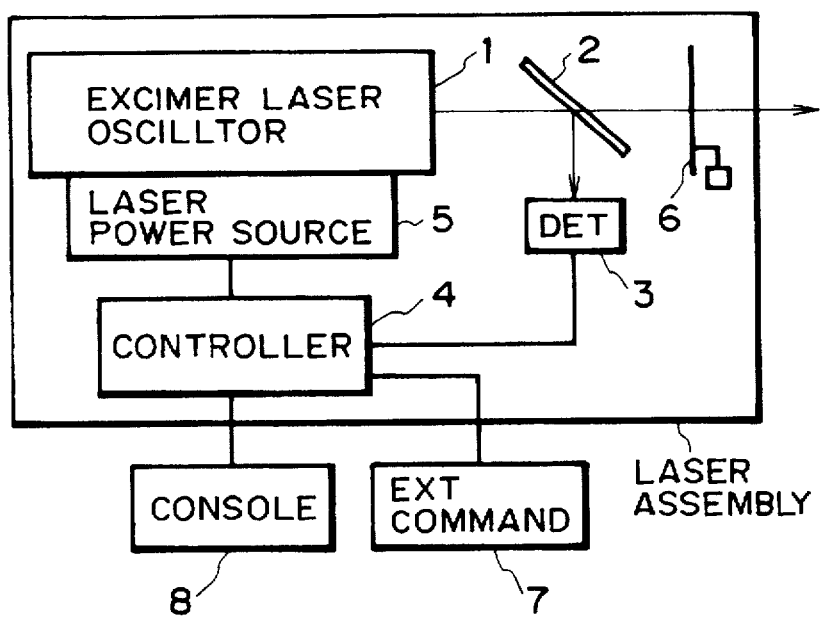
FIG. 4 is a schematic and diagrammatic view of an excimer laser.

FIG. 4 is a schematic and diagrammatic view of an excimer laser to which an output control method according to an embodiment of the present invention is applied.

A portion of laser light produced by an excimer laser oscillator 1 is reflected by a beam splitter 2, and it impinges on a detector 3. The detector 3 produces a photoelectric signal corresponding to the laser output, and a controller 4 determines laser output of each light pulse. The controller 4 has a storing circuit for memorizing the relation between discharge voltage and laser output, and it applies a command signal related to the discharge voltage, to a laser voltage source device 5. The laser voltage source device 5 applies a discharge voltage, corresponding to the command signal, to a discharge circuit included in the laser oscillator. On the other hand, the laser light passing through the beam splitter 2 can be blocked by a shutter 6 which is retractably placed across the light path.

Parameters such as standard light emission interval, discharge voltage, desired laser output and emission light pulse number, for example, are read out of an external equipment connected to an external command fetching port 7. Alternatively, they are directly applied to a console 8. In accordance with these parameters, the controller 4 controls the light emission interval and/or the discharge voltage.

The controller 4 of the excimer laser of this embodiment has a mode wherein the light emission interval is constant and another mode wherein the light emission interval is changed as desired to provided increased laser output. These modes are interchangeable in accordance with situations. External control means connected to the port 7 may be used to interchange these two modes.

If there is a difference between an expected laser output and an actually measured value as detected through the detector 3, parameters for controlling the laser output such as discharge voltage and/or light emission interval, for example, may be corrected. This enables more exact control of laser output.

Next, the method of controlling light emission interval which is most characteristic feature of this embodiment, will be explained.

Figure 5:
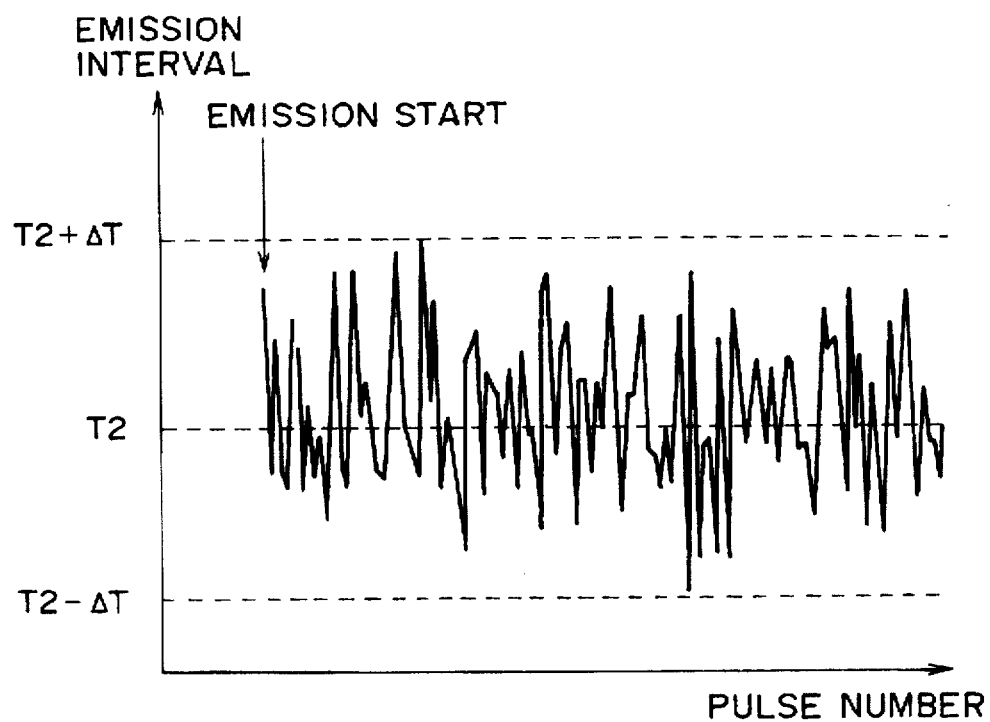
FIG. 5 is a graph for explaining the relation between light emission interval and pulse number.
Figure 6:
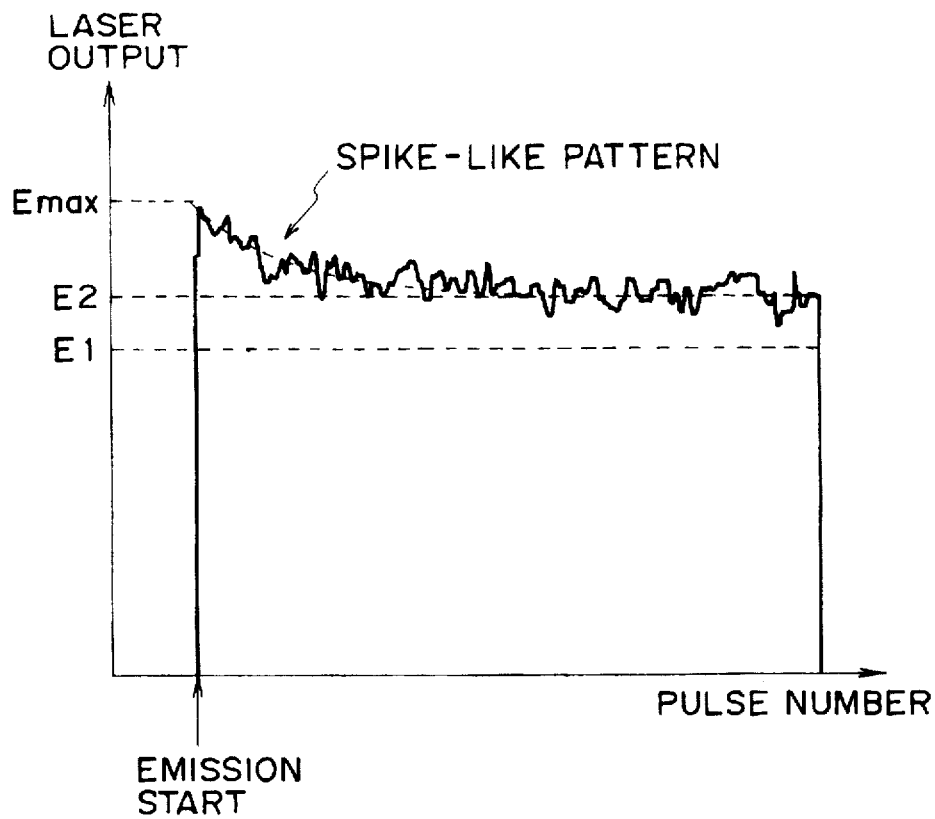
FIG. 6 is a graph for explaining the relation between laser output and pulse number, in a case where an output control method according to an embodiment of the present invention is used.

Referring to FIG. 5, a standard light emission interval is denoted by T2 and the width of changing the light emission interval is denoted by ΔT. Thus, within the range T2–ΔT to T2+ΔT, the laser emission interval is changed randomly, from start of light emission. By changing the light emission interval randomly as above to disturb the phenomenon of laser being converged toward a steady state, the laser output can be increased up to a stable level E2 (FIG. 6) above a stable level E1 which is attainable when the light emission interval is kept constant.

Figure 1:
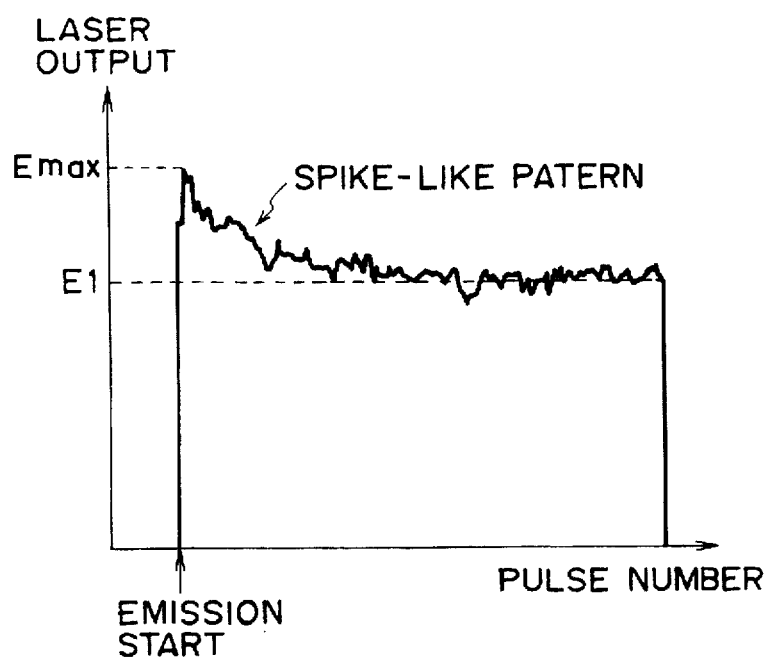
FIG. 1 is a graph for explaining the relation between laser output and number of excimer laser pulses.
Figure 2:
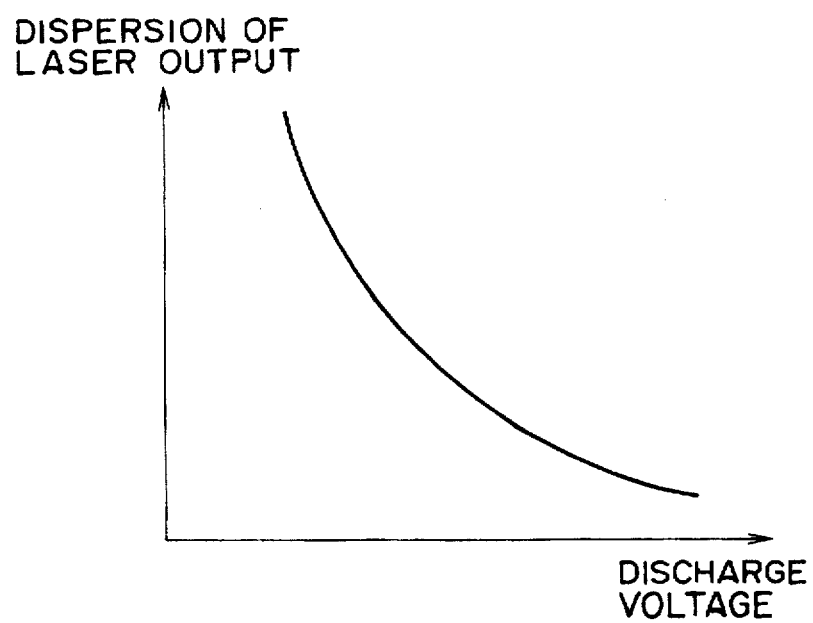
FIG. 2 is a graph for explaining the relation between laser output dispersion and discharge voltage.
Figure 7:
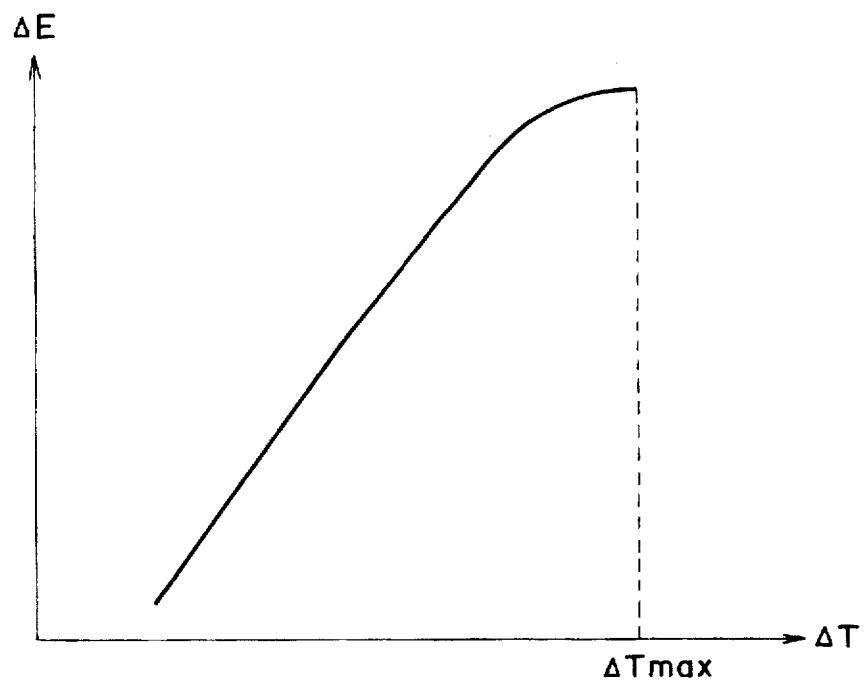
FIG. 7 is a graph for explaining the relation between laser output increase and changes in light emission interval.

Also, there is a relation such as shown in FIG. 7 between ΔT and the increase ΔE (=E2–El) of laser output. It is seen that the laser output can be controlled not only by control of discharge voltage but also by control of light emission interval. Thus, even in an occasion where, with a designated number of pulses, a desired light quantity is not obtainable through discharge voltage control, it is still possible to attain the desired light quantity by controlling the light emission interval.

Where the light emission interval is constant and the discharge voltage is constant such as the case of FIG. 1, although it differs depending on the laser discharge voltage, the level of laser output El after the steady state is reached is about 40% to 80% of the level of a peak output Emax of the spike phenomenon. As compared therewith, when the output control method of this embodiment for randomly changing the light emission interval is used, the level E2 can be increased, at the maximum, up to approximately 90% of the level Emax. This is in relation to a case where the laser is sufficiently kept stopped after continuous oscillation. If the time period of stoppage is short, the level Emax becomes lower and the ratio of E2 to Emax becomes higher correspondingly. It is therefore even possible to remove the spike phenomenon when the stoppage time is reduced to some extent.

Figure 8:
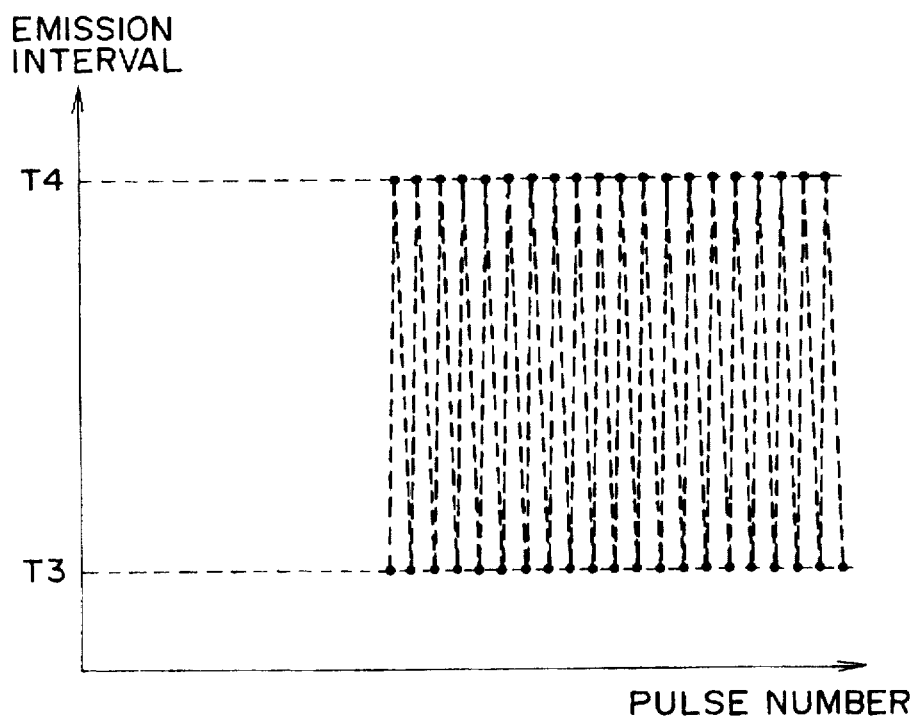
FIG. 8 is a graph for explaining light emission interval and pulse number.

In the present embodiment, the laser output is increased by changing the light emission interval randomly. However, two different light emission intervals (T3 and T4) may be interchangeably used such as shown in FIG. 8 or, alternatively, for every few pulses, the light emission interval may be changed. As a further alternative, the light emission interval may be changed gradually between particular two levels. With these methods, the laser output can be increased similarly.

Figure 9:
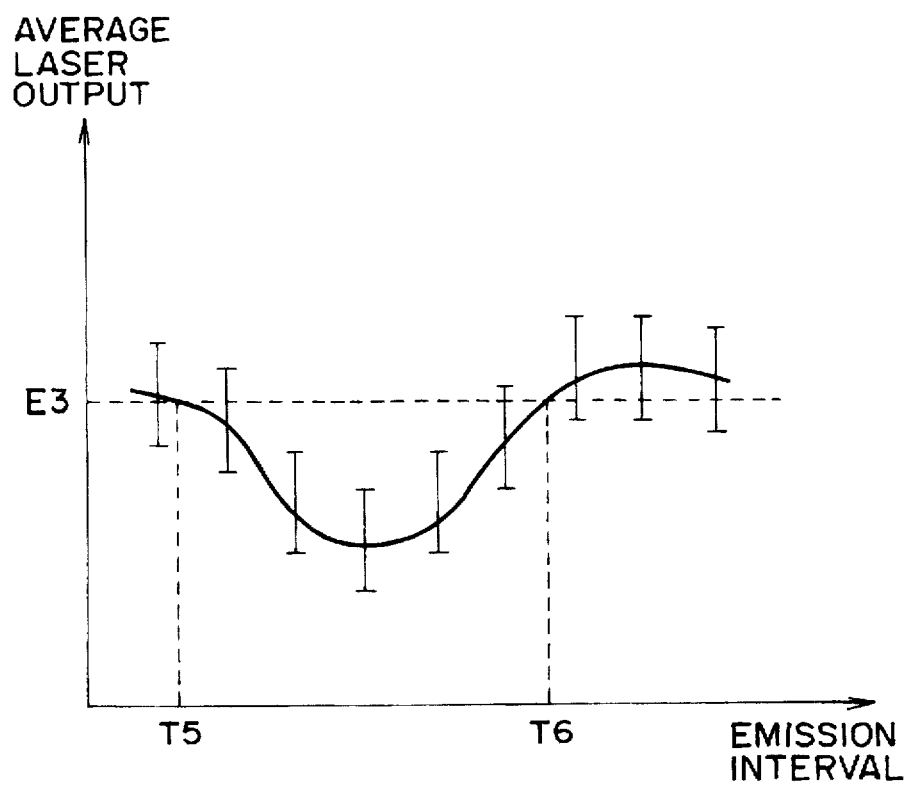
FIG. 9 is a graph for explaining the relation between average laser output and light emission interval.

Further, as shown in FIG. 9, the relation between light emission interval and average laser output may be detected beforehand, and the light emission interval control such as shown in FIG. 8 may be performed on the basis of T5 and T6 which are of different light emission intervals but which provide substantially the same laser output. This enables providing a higher laser output with less laser output dispersion as compared with a case where the light emission interval is changed randomly.

[Second Embodiment]

Figure 10:
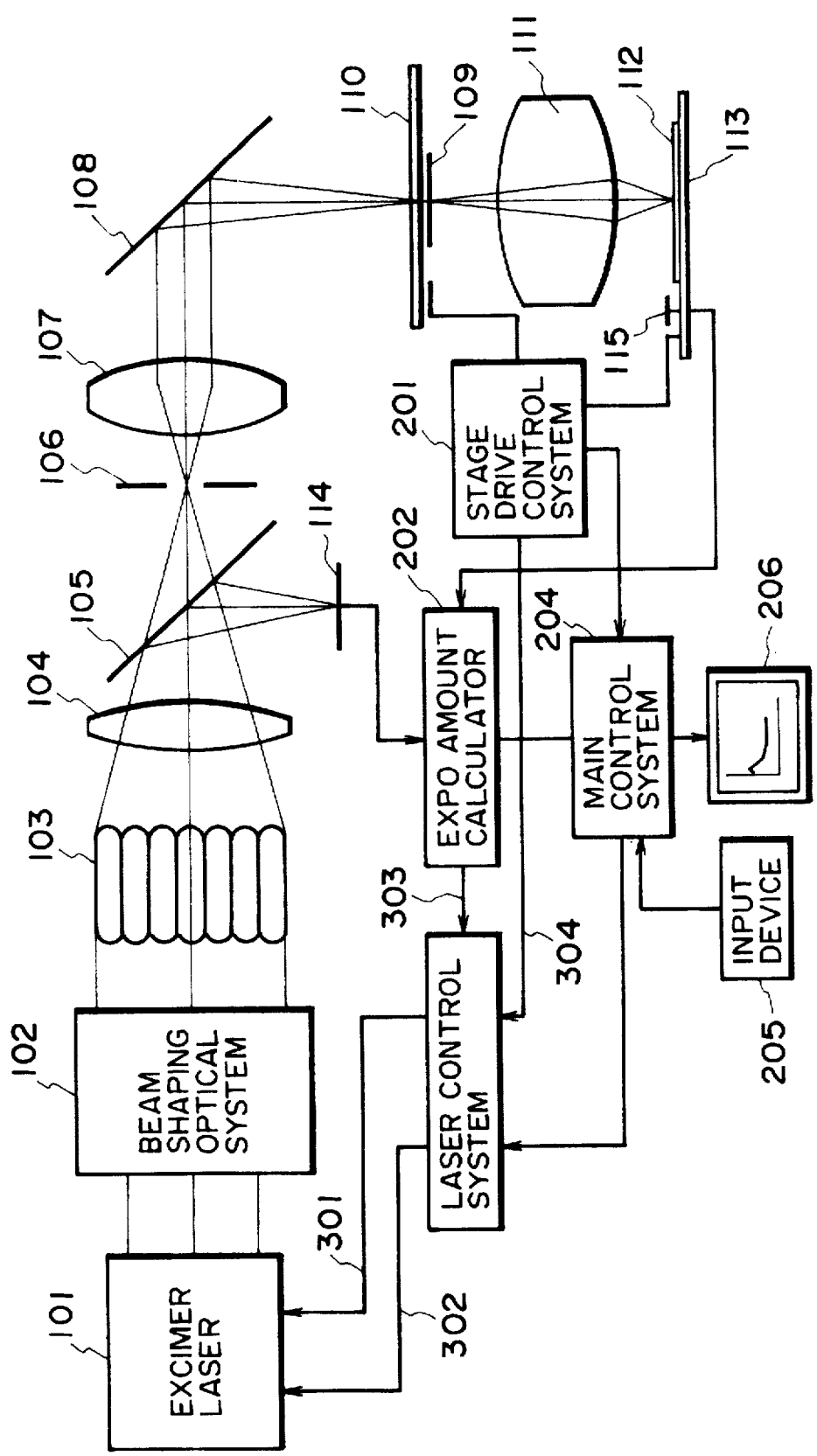
FIG. 10 is a schematic and diagrammatic view of an exposure apparatus according to an embodiment of the present invention.

FIG. 10 is a schematic and diagrammatic view of an exposure apparatus (stepper) for manufacture of semiconductor devices, to which a laser output control method according to an embodiment of the present invention is applied.

Light from an excimer laser 101 is transformed by a bean shaping optical system 102 into a desired shape, and it is then directed to a light entrance surface of an optical integrator 103 such as a fly's-eye lens, for example. The fly's-eye lens comprises a combination of plural small lenses, and plural secondary light sources are defined in the vicinity of a light exit surface thereof. Condenser lens 104 serves to perform Kohler illumination of a masking blade 106 with lights from the secondary light sources of the optical integrator 103.

A portion of pulse light divided by a half mirror 105 is directed to a first exposure amount detector 114. The masking blade 106 and a reticle 109 are disposed in an optically conjugate interrelationship with respect to an imaging lens 107 and a mirror 108, and an illumination region of a shape and size as determined by the shape of opening of the masking blade 106 is defined on the reticle 109. Denoted at 111 is a projection optical system for projecting a circuit pattern of the reticle 109 onto a wafer 112, in a reduced scale.

The reticle 109 is held fixed on a reticle stage 110, and it is aligned through the projection optical system 111 with respect to the wafer 112 which is held fixed on a wafer stage 113. Mounted on the wafer stage 113 is a second exposure amount detector 115. By using this detector 115, it is possible to monitor the exposure amount by the laser light passed through the optical system. Thus, by using the second exposure amount detector 115, non-uniformness of exposure amount can be checked.

Denoted at 201 is a stage drive controlling system for controllably driving the wafer stage 113. Denoted at 202 is exposure amount calculating means for calculating the exposure amount on the basis of signals from the first and second exposure amount detectors 114 and 115. Laser control system 203 serves to apply a trigger signal 301 and a discharge voltage signal 302 corresponding to a desired exposure amount, to the excimer laser 101 to thereby control the laser output and the light emission interval. Here, the trigger signal 301 and/or the discharge voltage signal 302 may be corrected in accordance with the results of detection through the first and second exposure amount detectors 114 and 115, this enabling more exact control of laser output to the desired laser output level.

The trigger signal 301 and the discharge voltage signal 302 are produced on the basis of parameters such as a stage current position signal 304 from the stage drive controlling system or hysteresis information from a main control system 204, for example. The main control system 204 serves to generally control the stage drive controlling system 201, the exposure amount calculating means 202 and the laser control system 203. Desired exposure amount may be inputted into an input device 205 automatically or manually by an operator. The results of detection through the first and second exposure amount detectors 114 and 115 may be displayed at a display 206.

Incorporating the laser output control method described with reference to the first embodiment into the laser control system 203, enables that, even when an ordinary excimer laser is used, substantially the same advantageous results are produced through the control on the stepper side.

When the output control method is applied to a stepper, it is necessary to determine the laser emission interval and the number of light pulses to be emitted, in accordance with throughput and desired integrated exposure amount. If the throughput is not designated, preferably the emission interval change width ΔT may be set to be equal to ΔTmax (FIG. 4) to increase the laser output as much as possible such that the number of exposure pulses is reduced. If the throughput is a priority factor, the light emission interval may be controlled in accordance with the relation between the standard light emission interval and the amount of increase of energy with the light emission change width. For example, the emission interval may be controlled between two levels of short light emission intervals.

Excimer lasers are pulsed lasers, and usually the exposure process is performed by using plural light pulses. However, since the laser output fluctuates by at least about 5% per each pulse, it is not easy to control to attain a correct exposure amount. Some proposals have been made to assure a desired and correct exposure amount.

An example is that: up to a particular exposure amount just less than a correct exposure amount, the exposure process is continued with the maximum output of an excimer laser (this is called "rough exposure process") and, thereafter, the laser output is controlled until the correct exposure amount is reached (this is called "fine exposure process").

Now, an embodiment of the present invention wherein the output control method is used in combination with the above-described exposure control method, will be explained.

Namely, in this embodiment of the present invention, until the integrated exposure amount reaches a predetermined level just less than a correct exposure amount, the laser emission interval is changed to perform a rough exposure process with a maximum level of increased laser output. During the rough exposure process, the exposure amount is monitored by using the first exposure amount detector 114. The detected exposure amount is memorized into the storing device included in the main control system 104, and the integrated exposure amount is calculated. When the integrated exposure amount reaches the predetermined level just less than the correct exposure amount, the laser output is controlled to perform a fine exposure process so that the integrated exposure amount comes close to the correct exposure amount.

As an alternative, the number of light pulses with which the rough exposure process is to be performed may be determined beforehand. In that occasion, the fine exposure process may be performed after the number of pulses emitted reaches the predetermined, to thereby attain the correct exposure amount.

Figure 11A:
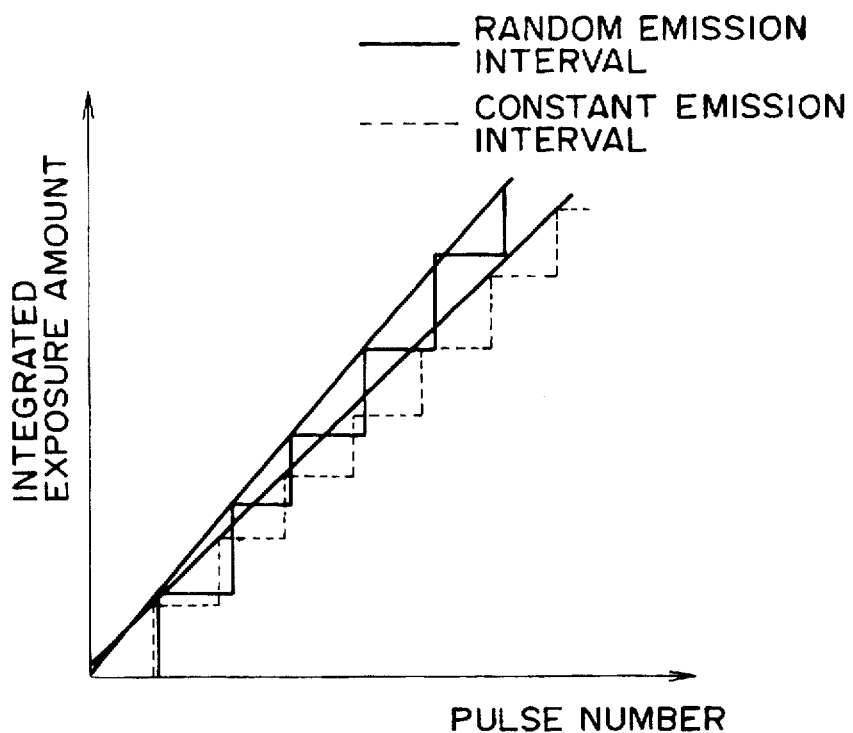
FIGS. 11A and 11B are graphs for explaining the relation between integrated exposure amount and pulse number.
Figure 11B:
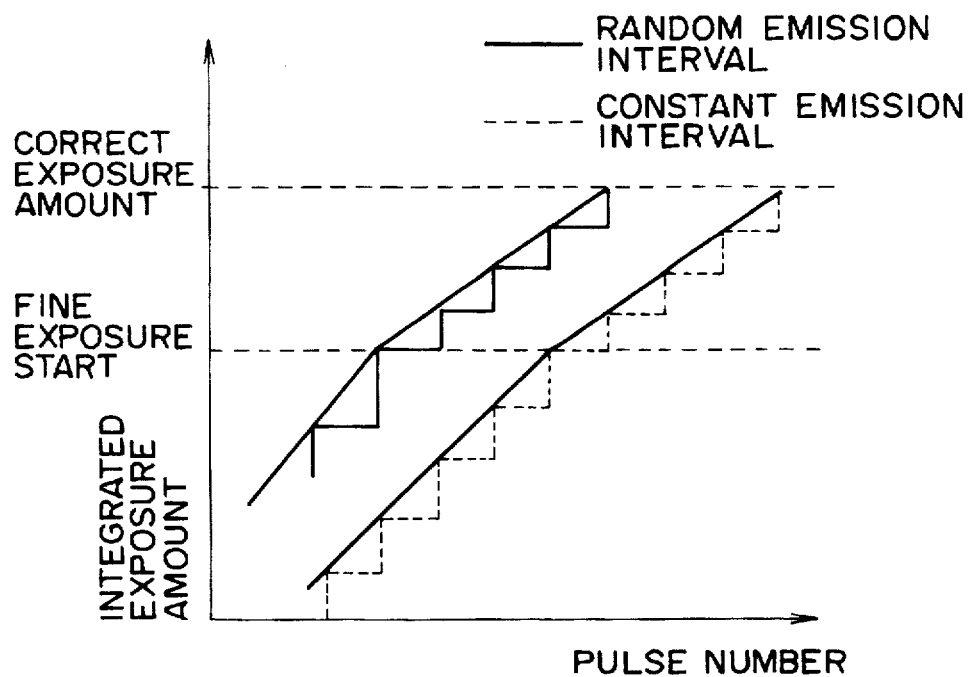

FIGS. 11A and 11B are graphs each for explaining changes in integrated exposure amount in cases wherein, for the same laser discharge voltage, the light emission interval is changed and the light emission interval is kept constant, respectively.

FIG. 11A concerns a rough exposure process. When the emission interval is changed randomly, as compared with a case where it is kept constant, the increase in integrated exposure amount with the number of projected light pulses is large. FIG. 11B concerns a fine exposure process in the vicinity of a desired or correct exposure amount. The fine exposure process is performed while controlling the laser output until the corrected exposure amount is reached. It is seen that, in accordance with the exposure method according to this embodiment of the present invention, correct exposure amount is attainable with less number of exposure pulses as compared with that in conventional exposure methods and, additionally, the exposure precision the same as that of the conventional exposure methods is attainable.

As for the light quantity control in the fine exposure process, the laser discharge voltage may be controlled to adjust the laser output to thereby attain a desired light quantity. Alternatively, filter means such as ND filter or interference filter may be inserted into the path of exposure light to attenuate the same to thereby attain a desired light quantity. In such occasions, the emission interval may be changed or kept unchanged, provided that a desired light quantity is obtainable stably.

Between ΔT and the laser output increase ΔE (=E2–E1), there is a relation such as depicted in FIG. 7, as described before. Thus, it is possible to control the laser output by modifying the emission interval change width ΔT. Namely, during the fine exposure process, the light emission interval may be controlled to adjust the light quantity.

In the exposure method according to this embodiment of the present invention, the light emission interval is changed randomly as depicted in FIG. 5. However, it may be changed in the manner such as depicted in FIG. 8 or 9.

[Third Embodiment]

Now, an embodiment of the present invention which is applied to a scan type exposure apparatus, will be explained.

A scan type exposure apparatus according to this embodiment can be embodied with a similar arrangement as of the exposure apparatus of the second embodiment having described with reference to FIG. 10.

In a scan type exposure apparatus, the stage drive controlling system 201 moves the reticle stage 110 and the wafer stage 113 in a timed relation, at a ratio corresponding to the magnification of the projection optical system 111, by which the reticle 109 and the wafer 112 are scanned in a direction along the widthwise direction of the illumination region of oblong shape, as defined by the masking blade 106. This enables exposure of an exposure region wider than the illumination region. It is a distinctive feature to a stepper.

Figure 12:
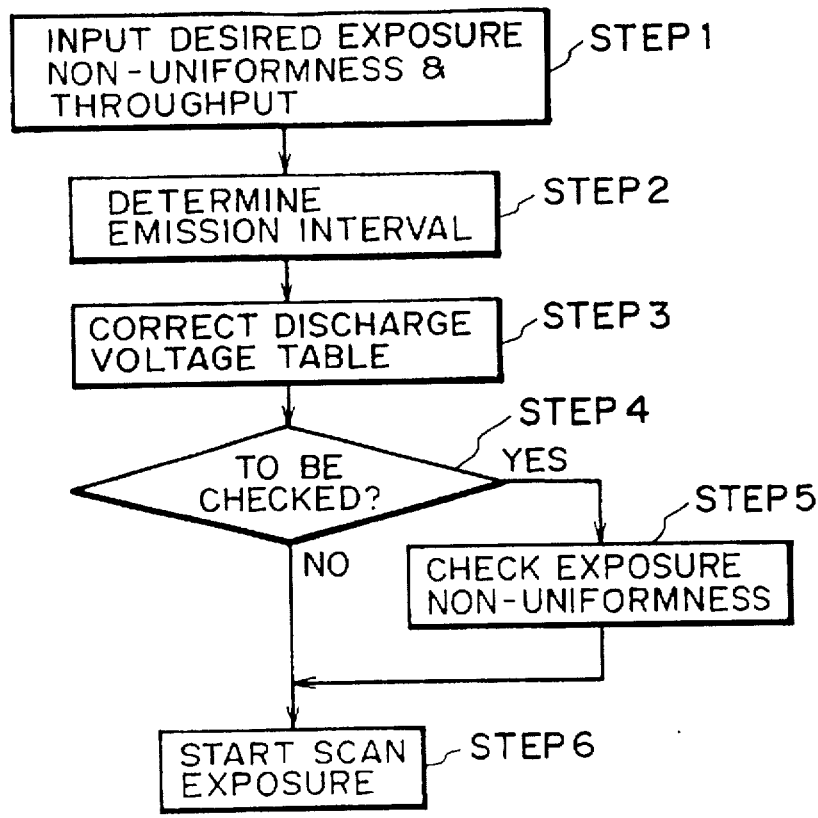
FIG. 12 is a flow chart for explaining exposure amount control according to an embodiment of the present invention.

FIG. 12 is a flow chart of exposure control procedure in this embodiment of the present invention.

First, at step 1, the operator designates parameters such as throughput by using the input device 205. Alternatively, parameters such as exposure non-uniformness and throughput, for example, may be automatically inputted to the input device 205 in accordance with a program set beforehand.

Then, at step 2, the light emission interval corresponding to the parameters set at step 1 is calculated. When the change width of emission interval is denoted by ΔT, it can be expressed as follows:

$$\Delta T = f(\sigma p, T) \tag{1}$$

where σp is a standard deviation of exposure non-uniformness, and T is a standard or reference light emission interval (as can be determined from the throughput).

Figure 3:
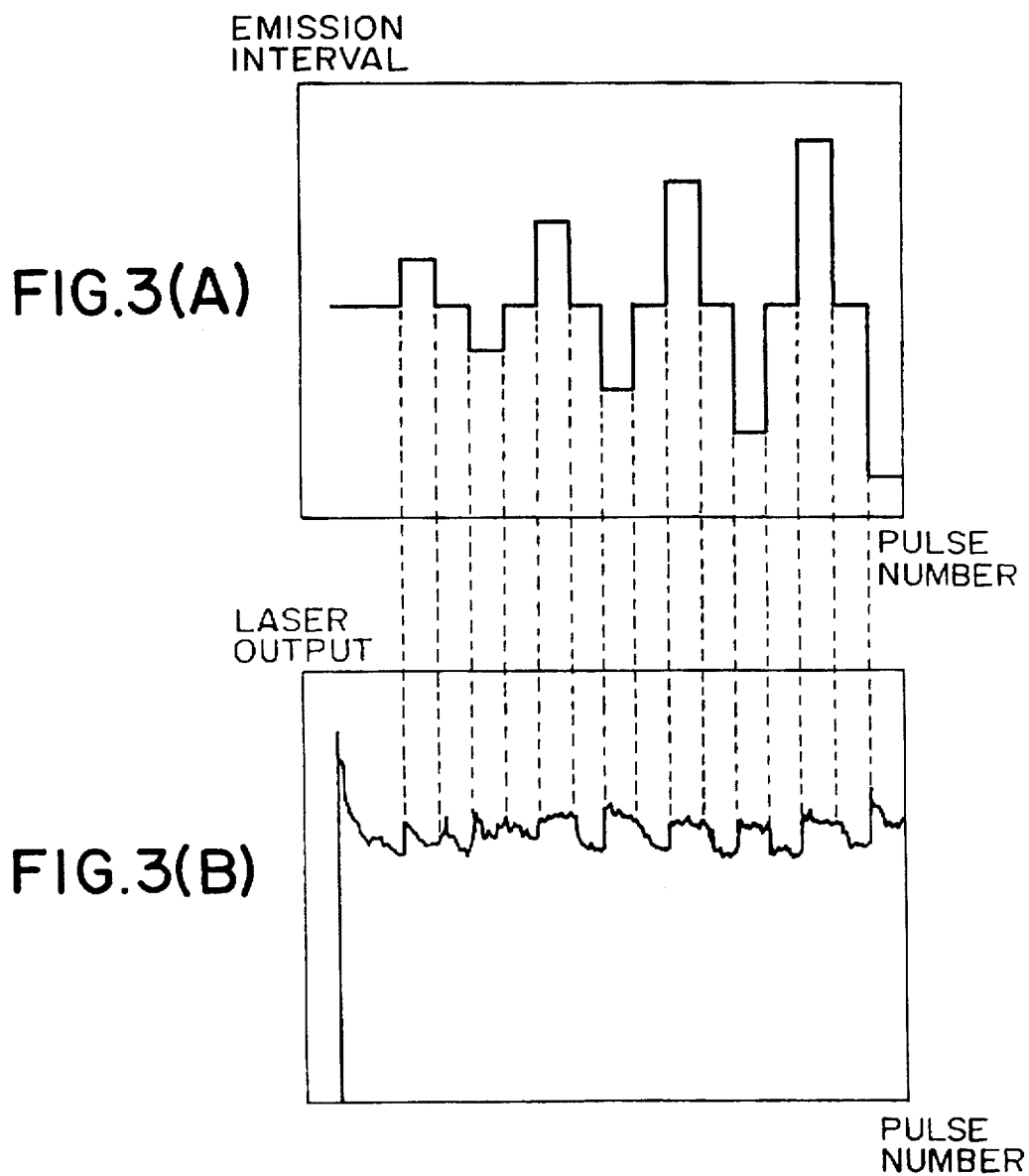
FIG. 3A and 3B are graphs for explaining a spike phenomenon occurring during successive laser emissions.

From equation (1) and while taking into account a noise component related to the exposure (e.g., laser output error, measurement error or stage position error), the interval change width ΔT that meets a desired exposure non-uniformness is determined. The light emission interval is determined within this change width ΔT, randomly as depicted in FIG. 3, (A).

Next, step 3 will be explained.

In scanning exposure apparatuses, it is necessary to perform the exposure process with a constant laser output, in order to suppress exposure non-uniformness. If the light emission interval is changed as in the case of this embodiment of the present invention, since the number of pulses projected differs with the location within the exposure range, there will be produced exposure non-uniformness provided that the exposure process is performed with constant laser output. In consideration of this, in step 3, the discharge voltage is controlled in accordance with the light emission interval as determined in step 2, so that the integrated exposure amount within the exposure region becomes uniform.

Figure 13:
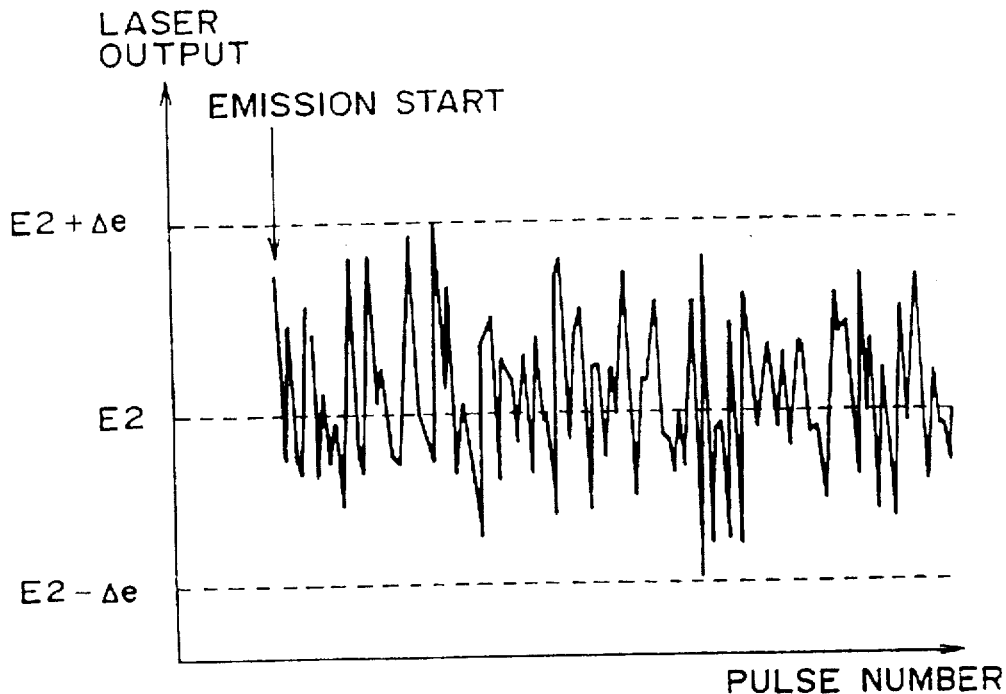
FIG. 13 is a graph for explaining the relation between laser output and pulse number, adapted to provide uniform exposure with the light emission interval as shown in FIG. 5.

More specifically, when the emission interval is changed as depicted in FIG. 5, the laser output may be controlled such as depicted in FIG. 13. More particularly, the laser output may be lowered if the emission interval is short, and it may be increased when the emission interval is long.

In order to obtain the laser output shown in FIG. 13, the relation between discharge voltage and laser output such as illustrated in FIG. 14 as well as the relation between emission interval change width and laser output such as illustrated in FIG. 7, may be used. More specifically, first, the laser output increase ΔE to be resulted from changing the emission interval such as shown in FIG. 5 may be determined from the relation shown in FIG. 7. Then, the increase ΔE may be subtracted from a desired laser output En of an n-th pulse (FIG. 13), and a discharge voltage Vn of the n-th pulse may be determined from the relation between discharge voltage and laser output of FIG. 14 where the emission interval is unchanged. That is:

$$Vn = f(E), \quad E = En - \Delta E \tag{2}$$

wherein f(E) is a function resulting from approximating the relation of FIG. 14 with multinominal, for example.

At step 4, discrimination is made as to whether the exposure non-uniformness is to be checked or not.

If it is to be checked, then at step 5, the second exposure amount detector 115 mounted on the wafer stage 113 is used to measure the exposure non-uniformness to be produced actually, before executing actual exposure of the wafer 112. The result of measurement may be displayed at the display 206, such that whether a desired exposure non-uniformness is satisfied o r not can be checked.

There are cases where the relation such as shown in FIG. 7 or 14 differs with standard emission interval and it causes exposure non-uniformness. In those cases, it is necessary to renew the relation of FIG. 7 or 14 in accordance with a standard emission interval to be used.

As an example, several types of relations for those of FIGS. 7 and 14, corresponding to different standard emission intervals may be prepared, and suitable ones may be selected in accordance with a standard emission interval to be used. Alternatively, while measuring the laser output through the first exposure amount detector 114, target laser outputs for the pulses may be set such as depicted in FIG. 13, and feedback control may be performed on the basis of the relation of the laser output to the discharge voltage in the preceding light emissions.

By using any of these methods singly or in combination, stable integration exposure is attainable.

At step 6, actual exposure of the wafer 112 starts.

By controlling the discharge voltage in accordance with the laser emission interval as described above, the exposure process with minimized exposure non-uniformness is assured.

Figure 16A:
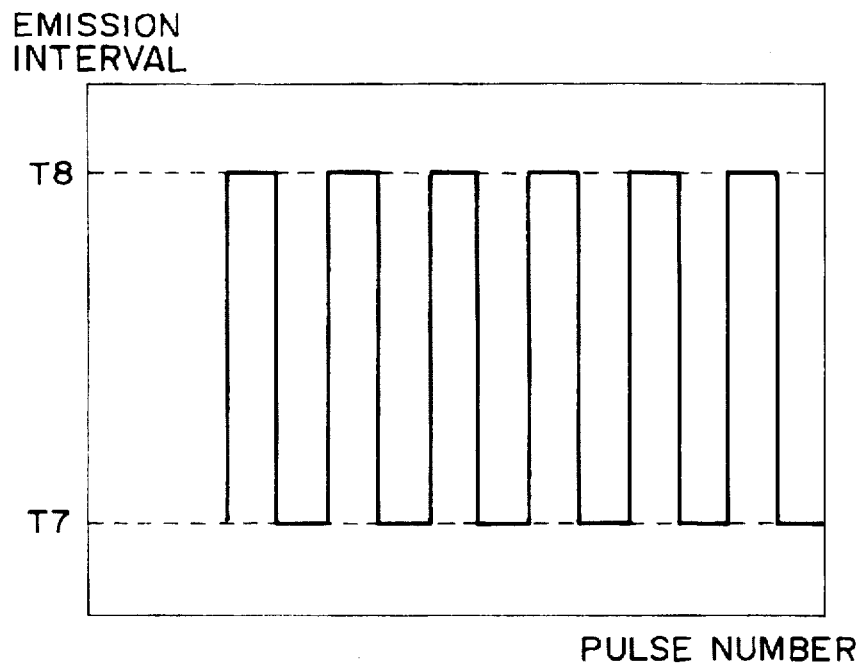
FIGS. 16A and 16B are graphs for explaining the relation between laser output and light emission interval, for attaining uniform exposure.
Figure 16B:
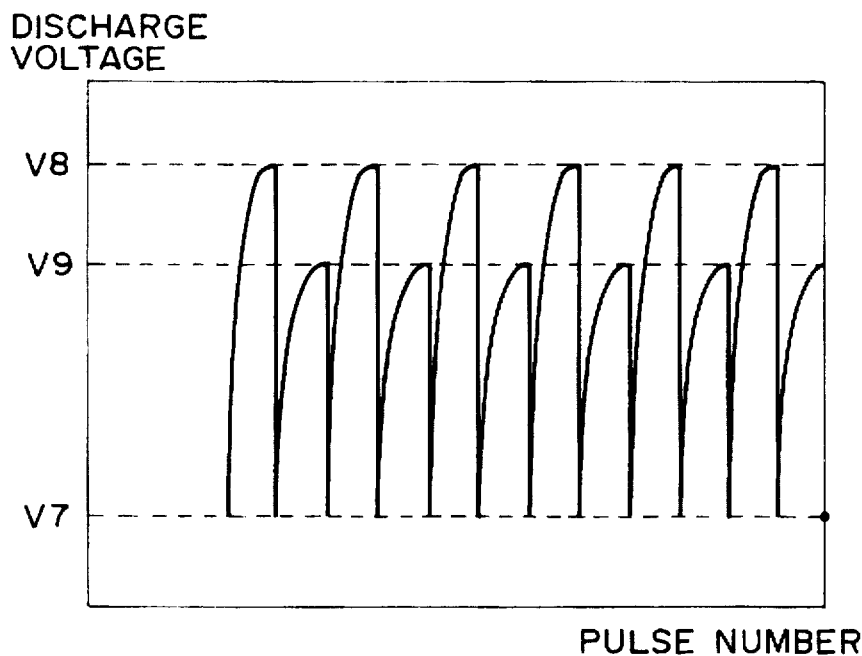

In this embodiment of the present invention, the emission interval is changed randomly and the laser output is increased by disturbing the steady state of laser. However, two different emission intervals (T3 and T4) may be interchangeably used for respective pulses, such as shown in FIG. 8, and simultaneously therewith the discharge voltage may be controlled in accordance with the emission interval, such as depicted in FIG. 15. Substantially the same advantageous results are obtainable in that case. Alternatively, the emission interval may be changed rectangularly per every several pulses, such as illustrated in FIG. 16A or 16B. As a further alternative, the emission interval may be changed gradually between two different levels, such as depicted in FIG. 9. In theses cases, by controlling the discharge voltage, substantially the same advantageous results as of the present embodiment are attainable.

When the emission interval is changed rectangularly as shown in FIG. 16A, there occurs spike phenomenon even during successive laser emissions such as illustrated in FIG. 13. In order to reduce the spike phenomenon during successive laser emissions, discharge voltage control such as illustrated in FIG. 16B may be performed. This enables uniform exposure of the wafer 112.

U.S. Pat. No. 5,491,534 shows an exposure amount control method wherein the timing of exposure through a current light pulse is controlled on the basis of the light quantity provided by a preceding light pulse. With this exposure control method, the light emission interval is changed in accordance with dispersion of laser output. Thus, there is a possibility that the laser output increases beyond an expected level, as has been described hereinbefore. In such occasion and particularly in the case of a scanning exposure apparatus as of this embodiment of the present invention, is may be difficult to correct satisfactorily the dispersion of integrated exposure amount resulting from laser output dispersion, only by controlling the exposure timing.

Figure 17:
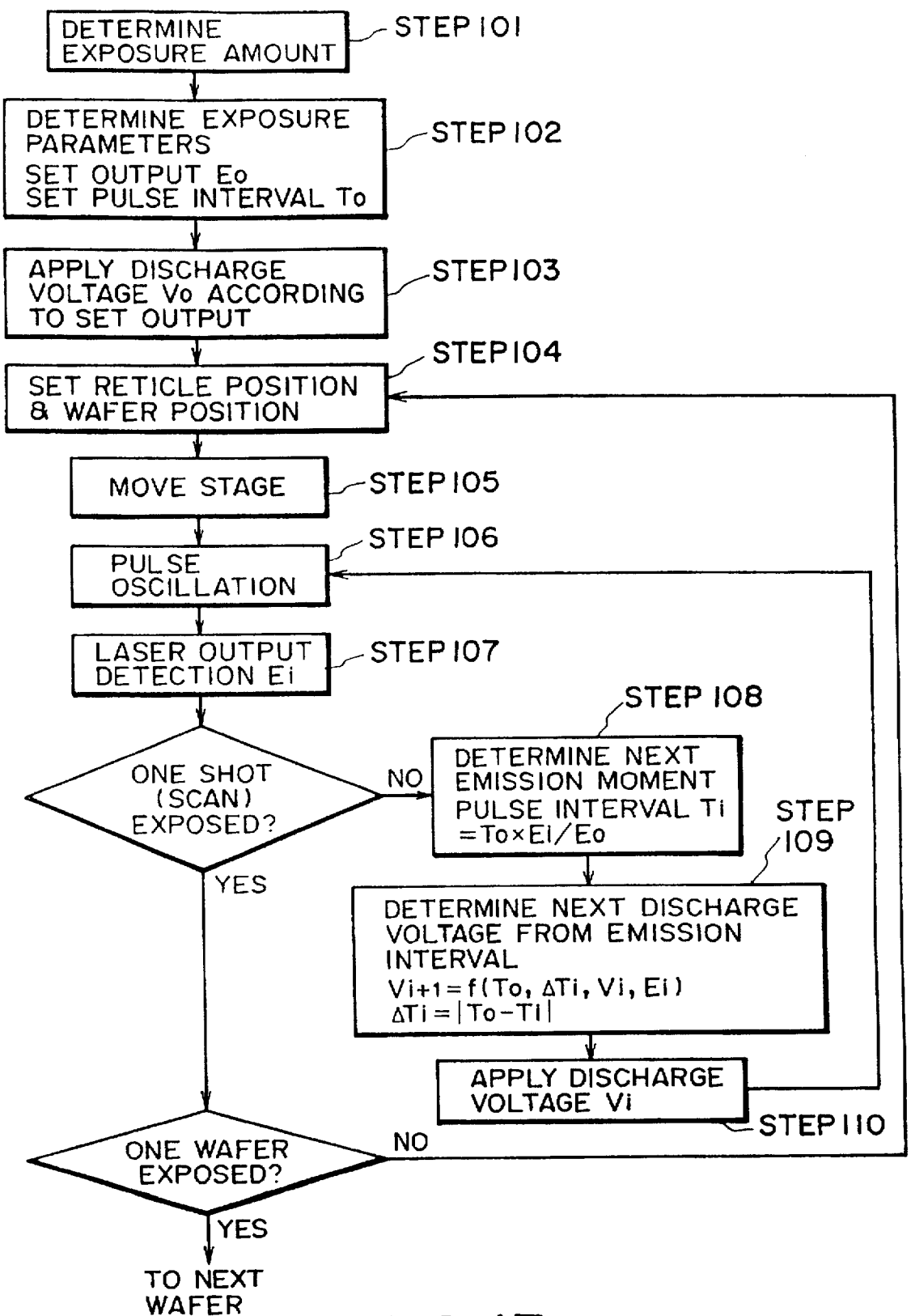
FIG. 17 is a flow chart for explaining an example of exposure control method, according to an embodiment of the present invention.

FIG. 17 is a flow chart for explaining an embodiment of exposure control method that solves the problem described above.

Referring to FIG. 17, in step 101, the exposure amount necessary for exposure of a resist of the wafer 112 is determined, this being done by using a test wafer, for example.

At step 102, in accordance with the required exposure amount as determined at step 101, parameters such as set output of the excimer laser 101, set pulse interval (reference light emission interval) of the laser, slit width of the masking blade 106, movement speeds of the reticle stage 110 and the wafer stage 113, for example, are determined. These parameters are determined while taking into account that the oscillation frequency or minimum exposure pulse number necessary for reducing the exposure non-uniformness are variable and, additionally, they are so determined as to provide a high throughput as much as possible. If necessary, the light quantity may be adjusted by using filter means such as ND filter, for example.

At step 103, a discharge voltage $V_0$ corresponding to the set output $E_0$ is applied.

At step 104, the wafer 112 and the reticle 109 are placed at predetermined positions, before start of exposure, and mutual alignment of the wafer and the reticle is adjusted.

At step 105, after the alignment process, the reticle stage 110 and the wafer stage 113 are moved scanningly.

At step 106, the excimer laser 101 is exited. If the excimer laser is oscillated before the exposure region of the reticle 109 enters the illumination area by the illumination light, the reticle 109 may be provided with a light blocking region or, alternatively, the shutter of the laser may be closed, to assure that the exposure light does not reach the wafer.

At step 107, the laser output $E_i$ used for the exposure is detected.

At step 108, from the set laser output $E_0$ and the laser output $E_i$ detected actually, the emission moment for the subsequent light pulse is determined. If the exposure process of one shot (one scan process) has not yet completed, the subsequent light pulse is emitted at the moment calculated.

As step 109, from the set pulse interval $T_0$ and the pulse emission interval $T_i$ of the pulse to be emitted subsequently, and from the exposure pulse energy $E_i$ and the discharge voltage $V_i$ thereof, the laser output of the subsequent (i+1)-th pulse is predicted. Then, such discharge voltage that assures constant laser output, is determined. Details of this procedure are as follows.

At the set pulse interval To, there is a relation similar to that shown in FIG. 7 among the laser output $E_i$, the emission interval difference $\Delta T_i$ and the energy increase $\Delta E$. It follows therefore that:

$$V_{i+1}=f(T_0, \Delta T_0, V_i, E_i)\Delta T=|T_0T_i| \quad (3)$$

On the basis of this data, the energy increase $\Delta E_i$ of the (i+1)-th pulse to the i-th pulse is predicted, and from the voltage versus laser output relation (FIG. 14) the discharge voltage for the (i+1)-th pulse is determined.

At step 110, the i-th pulse discharge voltage $V_i$ determined beforehand is set to the excimer laser 101. The sequence goes back to step 106, and the oscillation operations are repeated until the exposure process of one shot (one scan process) is completed. As regards $V_1$, however, a discharge voltage $V_0$ corresponding to the set energy $E_0$ is set.

Figure 18:
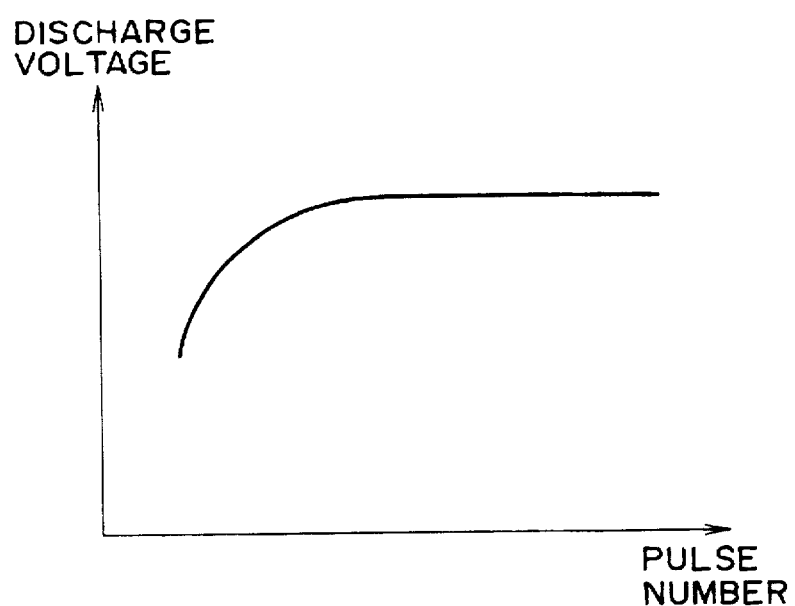
FIG. 18 is a graph for explaining the relation between discharge voltage and pulse number, for attaining a constant laser output.

Since there appears spike phenomenon at the start of oscillation, preferably discharge voltage tables corresponding to respective pulses, such as shown in FIG. 18, may be prepared in order to assure constant laser output. Further, it is desirable that calibration has been established between the set output of excimer laser and the exposure amount detecting system of the exposure apparatus. An average exposure amount corresponding to the set laser output may preferably be measured beforehand.

In this embodiment of the present invention as described above, the pulse emission interval is changed and, additionally, the discharge voltage for the excimer laser is adjusted, to thereby assure constant integrated exposure amount upon a wafer.

Next, another example of controlling the laser emission timing will be explained. In the description below, only the points different from the FIG. 17 embodiment will be explained.

At step 109 of the flow chart of FIG. 17, discharge voltage is corrected on the basis of a difference with respect to the reference light emission interval. In this example, however, voltage correction is made on the basis of a difference in emission interval between a preceding pulse and the pulse just before that pulse. The relation is such as follows:

$$V_{i+1}=f(T_0, \Delta T_i, V_i, E_i)\Delta T_i=|T_iT_{i-1}| \quad (4)$$

This method is applicable to a third laser pulse and pulses after that. Up to the second pulse, a discharge voltage $V_0$ corresponding to the set output $E_0$ is set.

Figure 19:
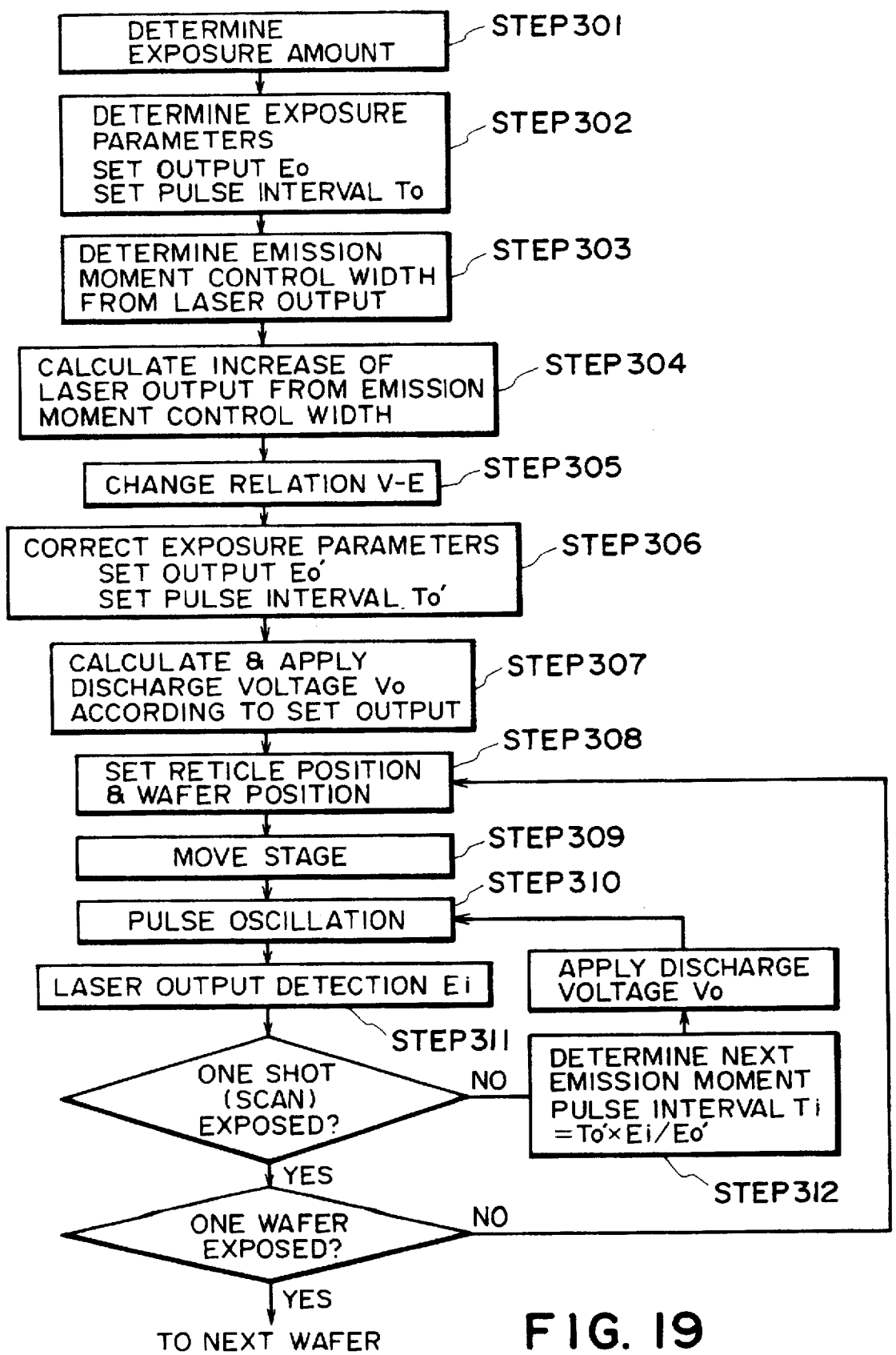
FIG. 19 is a flow chart for explaining another example of exposure amount control method, according to an embodiment of the present invention.

Referring now to FIG. 19, another example of exposure control method will be explained. In this example, the control width for emission timing is analyzed on the basis of laser output dispersion. In accordance with the control width, the increase of laser output is analyzed, and the set output and set pulse interval are corrected. In this method, the increase in laser output which results from changing the light emission timing is suppressed by reducing the discharge voltage, by which the light emission interval is extended and the integrated exposure amount is adjusted to optimum integrated exposure amount.

At step 301 in FIG. 19, the exposure amount necessary for exposure of a resist of the wafer 112 is determined, this being done by using a test wafer, for example.

At step 302, in accordance with the required exposure amount as determined at step 301, parameters such as set output of the excimer laser 101, set pulse interval (reference light emission interval) of the laser, slit width of the masking blade 106, movement speeds of the reticle stage 110 and the wafer stage 113, for example, are determined. These parameters are determined while taking into account that the oscillation frequency or minimum exposure pulse number necessary for reducing the exposure non-uniformness are variable and, additionally, they are so determined as to provide a high throughput as much as possible. If necessary, the light quantity may be adjusted by using filter means such as ND filter, for example.

At step 303, a control width for light emission interval is determined, from dispersion of the laser output.

At step 304, since the control width for emission interval and the increase of laser output are in such relation as shown in FIG. 7, the increase $\Delta E$ of laser output can be calculated from the control width as determined at step 303.

At step 305, since the relation between the discharge voltage and the laser output changes with the control width for the emission interval and thus the laser output per discharge voltage increases, the relation between the discharge voltage and the laser output is corrected in accordance with the control width for emission interval.

At step 306, from the exposure amount set at step 301, the parameters as having been determined at step 302 are determined again.

At step 307, a discharge voltage $V_0$ based on the set output is calculated and it is applied to the electrode.

At step 308, the wafer 112 and the reticle 109 are placed at predetermined positions, before start of exposure, and mutual alignment of the wafer and the reticle is adjusted.

At step 309, after the alignment process, the reticle stage 110 and the wafer stage 113 are moved scanningly.

At step 310, the excimer laser 101 is exited. If the excimer laser is oscillated before the exposure region of the reticle 109 enters the illumination area by the illumination light, the reticle 109 may preferably be provided with a light blocking region or, alternatively, the shutter of the laser may be closed, to assure that the exposure light does not reach the wafer.

At step 311, the laser output $E_i$ used for the exposure is detected.

At step 312, from the set laser output $E_0$ and the laser output $E_i$ detected actually, the emission moment for the subsequent light pulse is determined. If the exposure process of one shot (one scan process) has not yet completed, the subsequent light pulse is emitted at the moment calculated.

In this example of exposure control method, functionally two types of controls, the control of discharge voltage and the control of reference light emission interval, are performed simultaneously. The ratio of these operations may be determined in accordance with conditions such as throughput and acceptable exposure non-uniformness, for example.

Another example will now be explained. In the example described above, the reference light emission interval is changed. In the example to be described below, the control width for light emission timing is analyzed on the basis of laser output dispersion, and the increase of laser output is analyzed in accordance with the control width. The stage scanning speed is changed in accordance with the result, by which an optimum integrated exposure amount is attained.

Figure 20:
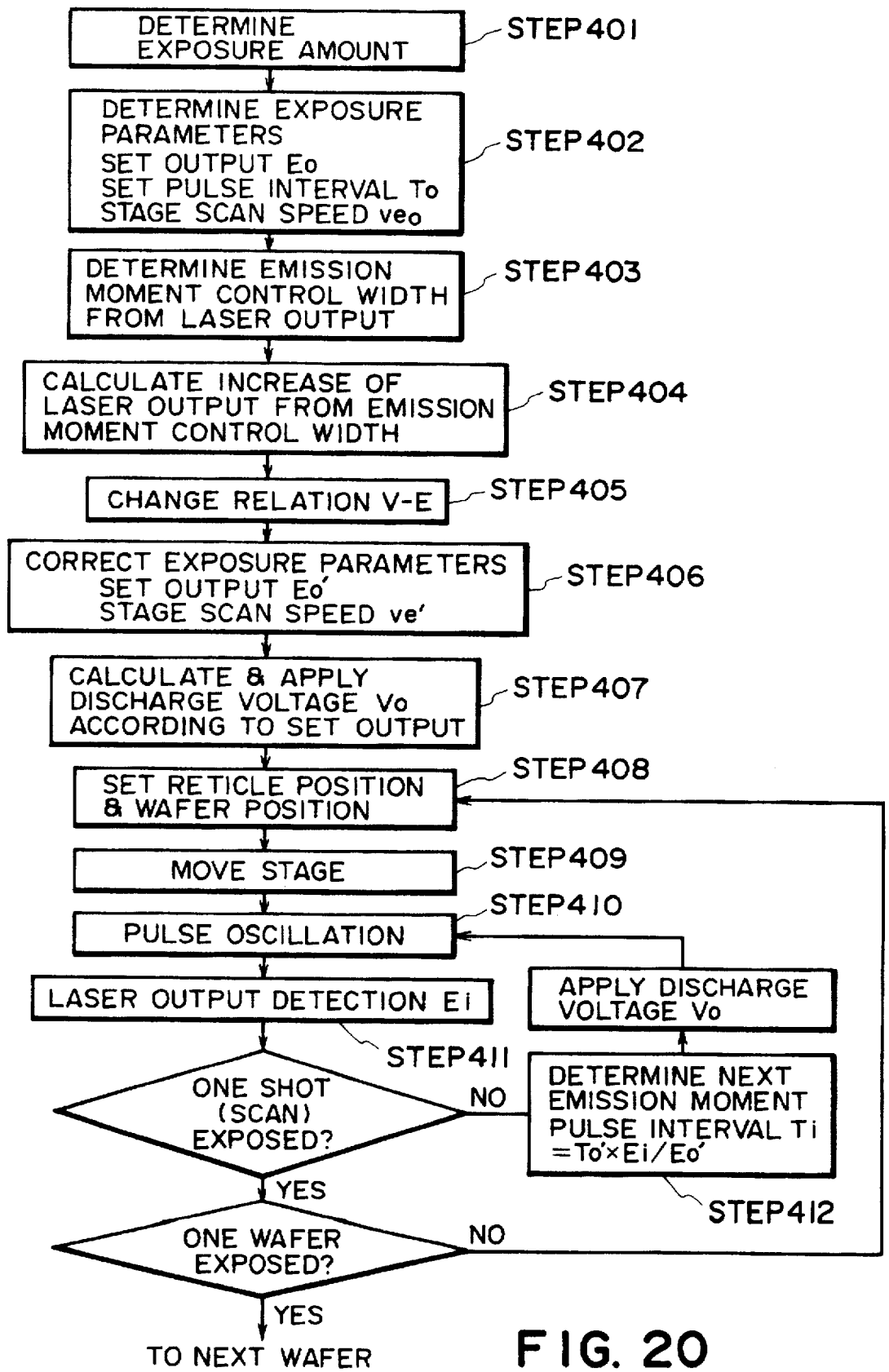
FIG. 20 is a flow chart for explaining a further example of exposure amount control method, according to an embodiment of the present invention.

FIG. 20 is a flow chart for explaining details of this example of exposure control method. While the flow chart of FIG. 20 is generally similar to that of FIG. 19, in the flow chart of FIG. 20 the step 306 of FIG. 19 is replaced by step 406. That is, at step 406, among the parameters as determined at step 402, from the exposure amount at step 401, the set output and the stage scanning speed are determined again. The remaining portion of this example is essentially the same as that of the FIG. 19 example.

[Fourth Embodiment]

Now, an embodiment of a semiconductor device manufacturing method which uses an exposure apparatus according to the second or third embodiment of the present invention, described hereinbefore, will be explained.

Figure 21:
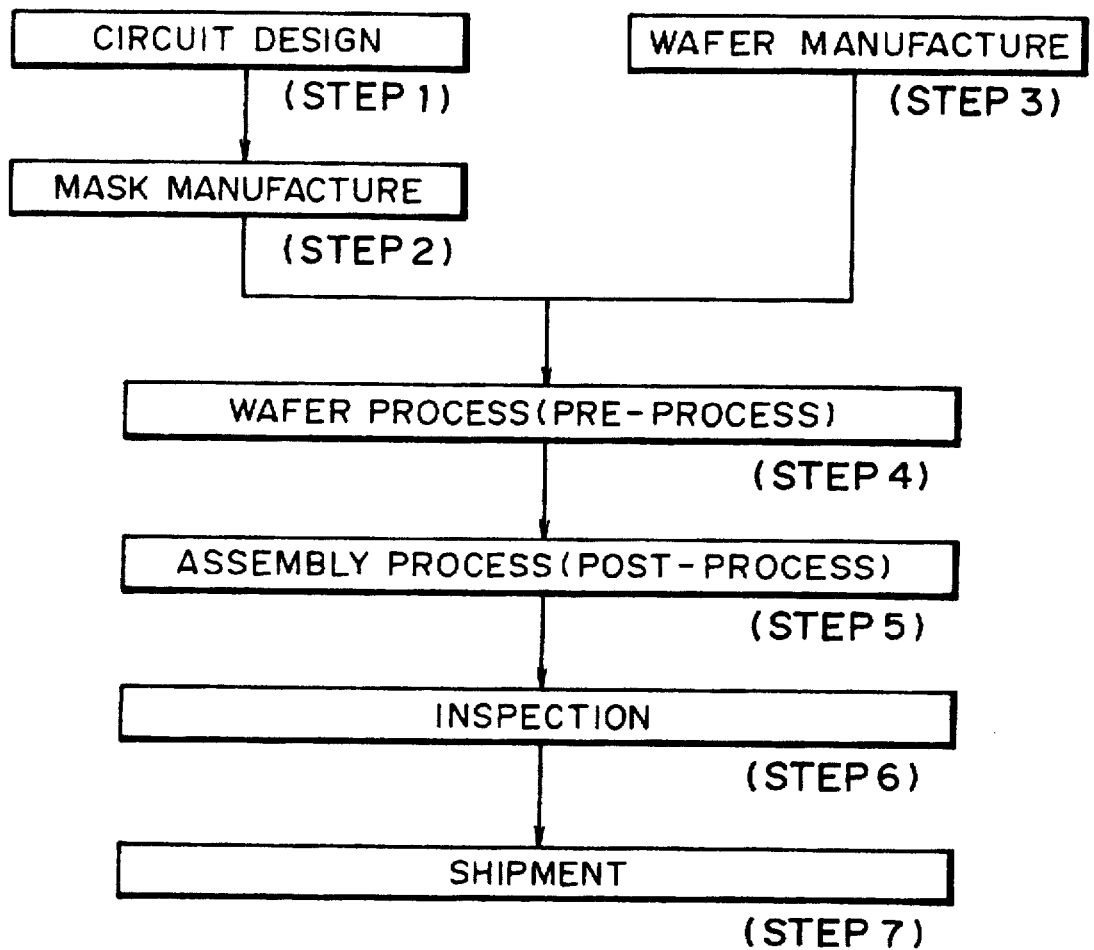
FIG. 21 is a flow chart for explaining semiconductor device manufacturing processes.

FIG. 21 is a flow chart of the sequence of manufacturing a semiconductor device such as a semiconductor chip (e.g. IC or LSI), a liquid crystal panel or a CCD, for example.

Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 22:
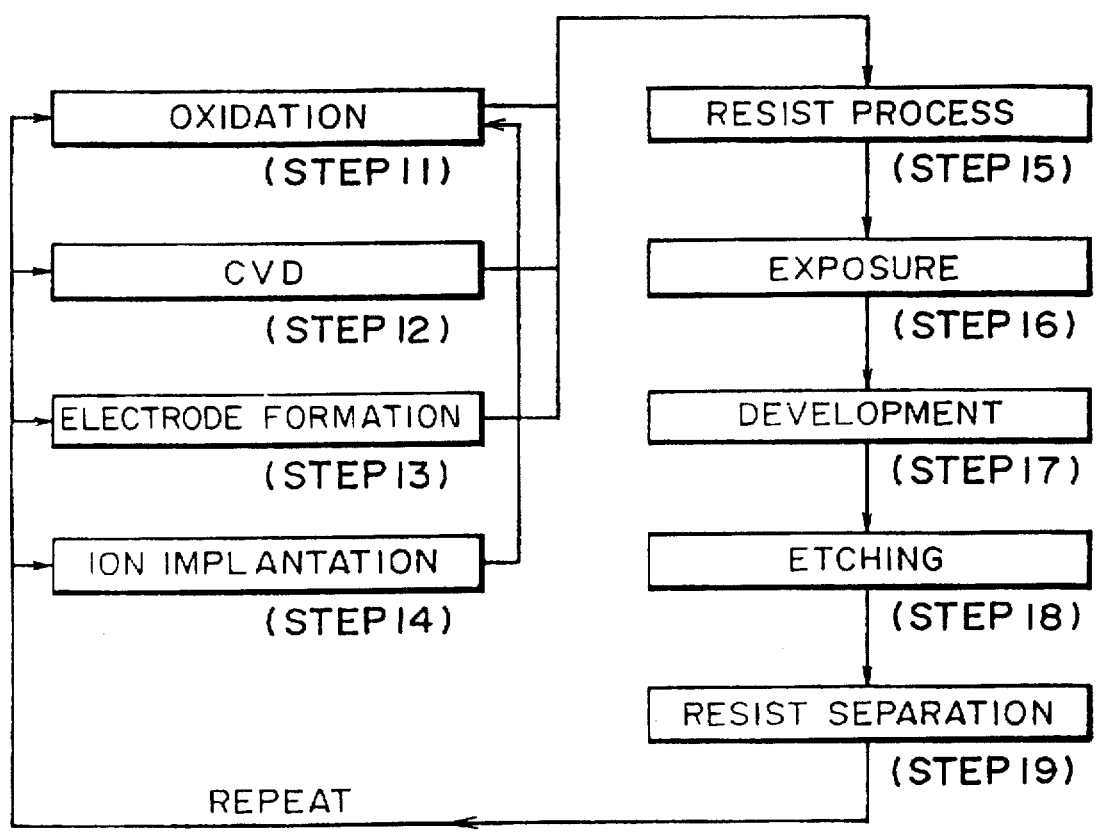
FIG. 22 is a flow chart for explaining details of a wafer process in the processes of the flow chart of FIG. 21.

FIG. 22 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An output control method for an excimer laser, comprising the steps of:

providing plural light pulses; and
    changing an emission interval for the light pulses;
    wherein the emission interval is controlled so that an average laser output of each light pulse becomes higher than that when the emission interval is unchanged.

2. An excimer laser according to claim 1, further comprising maintaining means for maintaining the emission interval constant, and interchanging means for interchanging said maintaining means and said changing means.

3. An excimer laser, comprising:

means for providing plural light pulses; and
    changing means for changing an emission interval for the light pulses;
    wherein the emission interval is controlled so that an average laser output of each light pulse becomes higher than that when the emission interval is unchanged.

4. An excimer laser according to claim 3, further comprising detecting means for detecting laser output of a light pulse provided, wherein said excimer laser controls the laser output on the basis of the detection by said detecting means.

5. An exposure apparatus, comprising:

an excimer laser; and
    changing means for changing an emission interval for light pulses to be provided by said excimer laser;
    wherein the emission interval is controlled so that an average laser output of each light pulse becomes higher than that when the emission interval is unchanged.

6. An apparatus according to claim 5, further comprising detecting means for detecting laser output of a light pulse provided, wherein said exposure apparatus controls the laser output on the basis of the detection by said detecting means.

7. An apparatus according to claim 5, wherein said changing means controls the emission interval so as to minimize an exposure time.

8. An apparatus according to claim 5, further comprising discharge voltage controlling means for controlling a discharge voltage of said excimer laser in accordance with a change in emission interval, wherein said discharge voltage controlling means controls the discharge voltage so that a laser output of each light pulse becomes substantially constant.

9. An exposure apparatus, comprising:

an excimer laser;
    changing means for changing an emission interval of light pulses to be provided by said excimer laser; and
    discharge voltage controlling means for controlling a discharge voltage of said excimer laser in accordance with a change in emission interval, wherein the discharge voltage is controlled so that a laser output of each light pulse becomes substantially constant.

10. An apparatus according to claim 9, wherein said exposure apparatus comprises a scan type exposure apparatus.

11. An exposure method, comprising:

causing an excimer laser to provide plural light pulses until a correct exposure amount of a substrate is reached; and
    changing a light emission interval, until a predetermined exposure amount smaller than the correct exposure amount is reached, so that an average laser output of each pulse becomes higher than that where the light emission interval is unchanged.

12. A method according to claim 11, further comprising, after the predetermined exposure amount is reached, controlling the laser output so that the exposure amount of the substrate becomes substantially equal to the correct exposure amount.

13. A device manufacturing method, comprising:

causing an excimer laser to provide plural light pulses to a substrate; and
    changing a light emission interval for the light pulses;
    wherein the light emission interval is controlled so that an average laser output of each pulse becomes higher than that where the light emission interval is unchanged.

14. A device manufacturing method, comprising the steps of:

causing an excimer laser to provide plural light pulses to a substrate;
    changing a light emission interval for the light pulses; and
    controlling discharge voltage for the excimer laser in accordance with a change in the light emission interval;
    wherein the discharge voltage is controlled so that a laser output of each pulse becomes substantially constant.

* * * * *

UNITED STATES PATENT AND TRADEMARK OFFICE
CERTIFICATE OF CORRECTION

PATENT NO. : 5,757,838
DATED : May 26, 1998
INVENTORS : NORIYASU HASEGAWA, ET AL.

It is certified that error appears in the above-identified patent and that said Letters Patent is hereby corrected as shown below:

IN THE DRAWINGS:

Sheet 1, Figure 1, "PATERN" should read --PATTERN--.
Sheet 3, Figure 4, In Logic Block 1, "OSCILLTOR" should read --OSCILLATOR--.

COLUMN 1:

line 13, "apparatus," should read --an apparatus,-- and "hundreds" should read --hundreds of--;
line 22, "electrode" should read --an electrode--;
line 24, "start" should read --a start--;
line 26, ""spike" should read --a "spike--;
line 29, "stable" should read --a stable--;
line 31, "low" should read --a low--;
line 32, "discharge" should read --a discharge--;
line 37, "start" should read --a start--;

UNITED STATES PATENT AND TRADEMARK OFFICE
CERTIFICATE OF CORRECTION

PATENT NO. : 5,757,838

DATED : May 26, 1998

INVENTORS : NORIYASU HASEGAWA, ET AL.

It is certified that error appears in the above-identified patent and that said Letters Patent is hereby corrected as shown below:

COLUMN 1: (cont'd)

line 41, "laser" should read --a laser-- and Fig. 3,(A)" should read --Fig. 3(A)--;
line 42, "(B)." should read --3(B).--;
line 43, "start" should read --a start--;
line 44, "Fig. 3, part (A)," should read --Fig. 3(A),--;
line 45, "Fig. 3, part (B)." should read --Fig. 3(B).--;
line 57, "higher" should read --a higher--; and
line 63, "an-exposure" should read --an exposure--.

UNITED STATES PATENT AND TRADEMARK OFFICE
CERTIFICATE OF CORRECTION

PATENT NO. : 5,757,838

DATED : May 26, 1998

INVENTORS : NORIYASU HASEGAWA, ET AL.

It is certified that error appears in the above-identified patent and that said Letters Patent is hereby corrected as shown below:

COLUMN 2:

line 19, "laser" should read --a laser--;
    line 32, "laser" should read --a laser--; and
    line 65, "where" should read --when--.

COLUMN 3:

line 10, "where" should read --when--.

COLUMN 4:

line 5, "uniform" should read --a uniform--;
    line 12, "exposure" should read --an exposure--;
    line 18, "exposure" should read --an exposure--;
    line 21, "exposure" should read --an exposure--; and
    line 51, "fetching" should read --accessing--.

COLUMN 5:

line 2, "most" should read --the most--;

UNITED STATES PATENT AND TRADEMARK OFFICE
CERTIFICATE OF CORRECTION

PATENT NO. : 5,757,838

DATED : May 26, 1998

INVENTORS : NORIYASU HASEGAWA, ET AL.

It is certified that error appears in the above-identified patent and that said Letters Patent is hereby corrected as shown below:

COLUMN 5:

line 8, "start" should read --the start--;
line 10, "laser" should read --the laser--;
line 17, "discharge" should read --the discharge-- and "light" should read --the light--;
line 18, "in" should read --on-- and "where," should read --when,--;
line 23, "Where" should read --When--;
line 45, "par-" should read --two par- --;
line 46, "two" should be deleted; and
line 63, "bean" should read --beam--.

COLUMN 6:

line 37, "this" should read --thus-- and "laser" should read --the laser--;
line 46, "Desired" should read --A desired--; and
line 59, "throughput" should read --the throughput--.

UNITED STATES PATENT AND TRADEMARK OFFICE
CERTIFICATE OF CORRECTION

PATENT NO. : 5,757,838

DATED : May 26, 1998

INVENTORS : NORIYASU HASEGAWA, ET AL.

It is certified that error appears in the above-identified patent and that said Letters Patent is hereby corrected as shown below:

COLUMN 7:

line 12, " "rough" should read --a "rough--;
    line 14, " "fine" should read --a "fine--;
    line 36, "In" should read --On--;
    line 38, "predetermined," should read --predetermined number,--;
    line 54, "correct" should read --a correct--;
    line 55, "less" should read --a fewer--;
    line 62, "ND" should read --an ND--;
    line 63, "interference" should read --an interference--; and
    line 65, "In" should read --On--.

COLUMN 8:

line 15, "as" should read --as that--;
    line 17, "described" should read --been described--;
    line 27, "exposure" should read --the exposure--;
    line 37, "emission" should read --the emission--;
    line 41, "exposure" should read --the exposure--;
    line 50, "FIG. 3,(A)." should read --FIG. 3(A).--; and

UNITED STATES PATENT AND TRADEMARK OFFICE
CERTIFICATE OF CORRECTION

PATENT NO.  : 5,757,838

DATED       : May 26, 1998

INVENTORS   : NORIYASU HASEGAWA, ET AL.

It is certified that error appears in the above-identified patent and that said Letters Patent is hereby corrected as shown below:

COLUMN 8:

line 59, "constant" should read --a constant--.

COLUMN 9:

line 18, "multinominal," should read --polynomial,--;
    line 19, "discrimination" should read --a discrimination--;
    line 25, "measurement" should read --the measurement--;
    line 27, "o r" should read --or--;
    line 29, "standard" should read --a standard--;
    line 52, "laser" should read --the laser--;
    line 64, "as" should read --as those--; and
    line 67, "spike" should read --a spike--.

COLUMN 10:

line 11, "laser" should read --the laser--;
    line 13, "In" should read --On--;
    line 14, "occasion" should read --an occasion--;
    line 16, "is" should read --it--;

UNITED STATES PATENT AND TRADEMARK OFFICE
CERTIFICATE OF CORRECTION

PATENT NO. : 5,757,838

DATED : May 26, 1998

INVENTORS : NORIYASU HASEGAWA, ET AL.

It is certified that error appears in the above-identified patent and that said Letters Patent is hereby corrected as shown below:

COLUMN 10:

line 20, "exposure" should read --an exposure--;
    line 37, "ND" should read --an ND--;
    line 41, "start" should read --the start--;
    line 45, "exited." should read --excited.--;
    line 55, "completed," should read --been completed,--; and
    line 61, "discharge" should read --a discharge--.

COLUMN 11:

line 12, "spike" should read --a spike--;
    line 13, "preferably" should read --preferably,--;
    line 15, "constant" should read --a constant--;
    line 17, "excimer" should read --the excimer--;
    line 24, "constant" should read --a constant--;
    line 41, "exposure" should read --an exposure--;
    line 51, "optimum" should read --an optimum--; and
    line 67, "ND" should read --an ND--.

UNITED STATES PATENT AND TRADEMARK OFFICE
CERTIFICATE OF CORRECTION

PATENT NO. : 5,757,838

DATED : May 26, 1998

INVENTORS : NORIYASU HASEGAWA, ET AL.

It is certified that error appears in the above-identified patent and that said Letters Patent is hereby corrected as shown below:

COLUMN 12:

```
line 4,  "relation" should read --a relation--;
line 5,  "laser" should read --the laser--;
line 19, "start" should read --the start--;
line 23, "exited." should read --excited.--;
line 35, "completed," should read --been completed,--;
line 37, "exposure" should read --the exposure--;
line 52, "exposure" should read --the exposure--;
line 66, "(e.g." should read --(e.g.,--; and
line 67, "IC or LSI)," should read --an IC or
an LSI),--.
```

COLUMN 13:

```
line 13, "operability" should read --an operability--;
line 14, "durability" should read --a durability--; and
line 63, "laser" should read --a laser--.
```

UNITED STATES PATENT AND TRADEMARK OFFICE
CERTIFICATE OF CORRECTION

PATENT NO. : 5,757,838

DATED : May 26, 1998

INVENTORS : NORIYASU HASEGAWA, ET AL.

It is certified that error appears in the above-identified patent and that said Letters Patent is hereby corrected as shown below:

COLUMN 14:

line 9, "laser" should read --a laser--; and
    line 60, "discharge" should read --a discharge--.

Signed and Sealed this

Fourth Day of May, 1999

Attest:

Q. TODD DICKINSON

*Attesting Officer*     Acting Commissioner of Patents and Trademarks